United States Patent
Liu et al.

(10) Patent No.: US 9,196,646 B2
(45) Date of Patent: Nov. 24, 2015

(54) METHOD FOR REDUCING CROSSTALK IN IMAGE SENSORS USING IMPLANT TECHNOLOGY

(71) Applicant: TAIWAN SEMICONDUCTOR MANUFACTURING COMPANY, LTD., Hsinchu (TW)

(72) Inventors: Jen-Cheng Liu, Hsinchu (TW); Ching-Hung Cheng, Hsinchu (TW); Chien-Hsien Tseng, Hsinchu (TW); Chia-Hao Hsu, Hsinchu (TW); Feng-Jia Shiu, Hsinchu (TW); Shou-Gwo Wuu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 271 days.

(21) Appl. No.: 13/891,846

(22) Filed: May 10, 2013

(65) Prior Publication Data

US 2013/0249041 A1    Sep. 26, 2013

Related U.S. Application Data

(62) Division of application No. 11/682,633, filed on Mar. 6, 2007, now Pat. No. 8,440,495.

(51) Int. Cl.
  *H01L 27/148* (2006.01)
  *H01L 27/146* (2006.01)

(52) U.S. Cl.
  CPC ...... *H01L 27/1463* (2013.01); *H01L 27/14689* (2013.01)

(58) Field of Classification Search
  CPC ............... H01L 27/14643; H01L 27/14683; H01L 2924/14; H01L 31/1126; H01L 27/14689; H01L 27/1463; H01L 27/14625; H01L 27/1461; H01L 27/14638; H01L 27/148; H04N 9/045
  See application file for complete search history.

(56) References Cited

U.S. PATENT DOCUMENTS

| | | | |
|---|---|---|---|
| 5,446,297 A * | 8/1995 | Lee ............................... | 257/223 |
| 6,037,018 A | 3/2000 | Jang et al. | |
| 6,177,333 B1 * | 1/2001 | Rhodes ......................... | 438/433 |

(Continued)

FOREIGN PATENT DOCUMENTS

| | | |
|---|---|---|
| CN | 1901213 | 1/2007 |
| JP | 03185749 | 8/1991 |

(Continued)

OTHER PUBLICATIONS

Chinese Intellectual Property Office, Office Action, Application No. 2007101851769, Aug. 21, 2009, 5 pgs.
Japanese Patent Office, Office Action, Application No. 2007-245299, Jul. 20, 2010, 5 pgs.
Korean Intellectual Property Office, Notice of Preliminary Rejection, Application No. 10-2007-0125127, Oct. 18, 2009, 9 pgs.

(Continued)

*Primary Examiner* — Davienne Monbleau
*Assistant Examiner* — Gustavo Ramallo
(74) *Attorney, Agent, or Firm* — Haynes and Boone, LLP

(57) ABSTRACT

The present disclosure provides an image sensor semiconductor device. A semiconductor substrate having a first-type conductivity is provided. A plurality of sensor elements is formed in the semiconductor substrate. An isolation feature is formed between the plurality of sensor elements. An ion implantation process is performed to form a doped region having the first-type conductivity substantially underlying the isolation feature using at least two different implant energy.

20 Claims, 7 Drawing Sheets

(56) References Cited

U.S. PATENT DOCUMENTS

| | | | |
|---|---|---|---|
| 6,351,002 B1 * | 2/2002 | Pan | 257/233 |
| 6,417,071 B2 | 7/2002 | Jang | |
| 6,495,391 B1 * | 12/2002 | Chan | 438/59 |
| 6,815,787 B1 | 11/2004 | Yaung et al. | |
| 6,876,016 B2 | 4/2005 | Chan | |
| 6,885,047 B2 | 4/2005 | Shinohara et al. | |
| 6,949,445 B2 | 9/2005 | Rhodes et al. | |
| 6,967,316 B2 | 11/2005 | Lee | |
| 6,982,443 B2 | 1/2006 | Hsu et al. | |
| 7,060,960 B2 | 6/2006 | Ohta et al. | |
| 7,504,307 B2 * | 3/2009 | Peake | 438/270 |
| 2003/0100168 A1 | 5/2003 | Lee et al. | |
| 2004/0164227 A1 | 8/2004 | Ohta et al. | |
| 2004/0166620 A1 * | 8/2004 | Logan et al. | 438/199 |
| 2005/0279998 A1 * | 12/2005 | Cole et al. | 257/59 |
| 2007/0018264 A1 * | 1/2007 | Rhodes et al. | 257/432 |
| 2008/0217719 A1 | 9/2008 | Liu et al. | |
| 2009/0078978 A1 * | 3/2009 | Rhodes | 257/292 |
| 2012/0319242 A1 * | 12/2012 | Mao et al. | 257/544 |

FOREIGN PATENT DOCUMENTS

| | | |
|---|---|---|
| JP | 2004266159 | 9/2004 |
| JP | 2006190769 | 7/2006 |
| KR | 20040058776 | 7/2004 |
| TW | 200633196 | 9/2006 |

OTHER PUBLICATIONS

Taiwanese Patent Office, Office Action, Application No. 096105331, Mar. 1, 2001, 8 pgs.

2144.05 Obviousness of Ranges [R-3]—2100 Patentability, www.uspto.gov/web/offices/pac/mpep/documents/2100__2144__05.htm, 4 pgs.

Korean Intellectual Property Office, Notice of Preliminary Rejection. Application No. 10-2007-0125127, Oct. 18, 2009, 9 pgs.

'2144.05 Obviousness of Ranges [R-3]—2100 Patentability, www.uspto.gov/web/offices/pac/mpep/documents/2100__2144__05.htm, 4 pgs, 2006.

* cited by examiner

METHOD FOR REDUCING CROSSTALK IN IMAGE SENSORS USING IMPLANT TECHNOLOGY

PRIORITY DATA

The present application is a divisional application of U.S. patent application Ser. No. 11/682,633, filed Mar. 6, 2007, which is incorporated herein by reference in its entirety.

BACKGROUND

In semiconductor technologies, image sensors include a plurality of sensor elements, or pixels, formed in a semiconductor substrate. The sensor elements are used for sensing a volume of exposed light projected towards the semiconductor substrate. The sensor elements can be formed on the front side of the substrate and light can be projected towards the front side or the backside of the substrate to reach the sensors. However, light targeted for one sensor element (and the electrical signal induced thereby) may spread to other sensor elements, which causes crosstalk. Improvements of the image sensors and/or the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
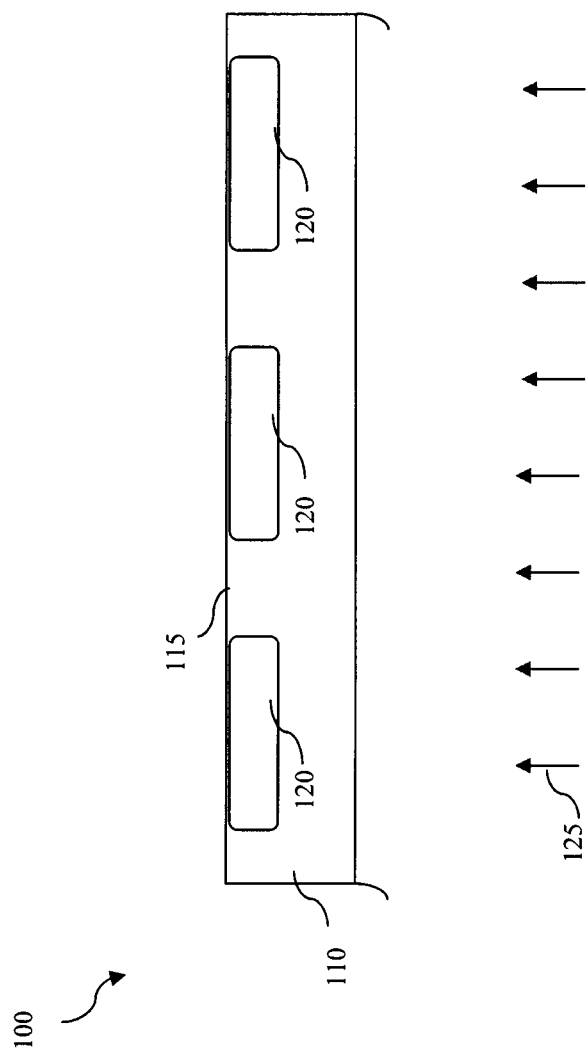
FIG. 1 is a diagram illustrating an exemplary image sensor.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a semiconductor device 100 includes a semiconductor substrate 110. The substrate 110 includes silicon in a crystalline structure. The substrate 110 may include various p-type doped regions and/or n-type doped regions configured and coupled to form various devices and function features. All doping may be implemented using a process such as ion implantation or diffusion in various steps and techniques. The substrate 110 may include other features such as an epi layer, a semiconductor on insulator (SOI) structure, or combinations thereof.

The semiconductor device 100 includes sensor elements 120 (also referred to as pixels) formed in and/or on the front surface 115 of the semiconductor substrate 110. In one embodiment, the sensor elements 120 may be disposed on the front surface 115 and extend into the semiconductor substrate 110. The sensor elements 120 each include a light-sensing region (also referred to as an image sensing region or photo-sensing region) which may be a doped region having N-type and/or P-type dopants formed in the semiconductor substrate 110 by a method such as diffusion or ion implantation. The light-sensing region may have a doping concentration ranging between about $10^{14}$ and $10^{21}$ atoms/cm$^3$. The light-sensing region may have a surface area ranging between about 10% and 80% area of the associated sensor element, being operable to receive radiation (e.g., light) from an object to be imaged. Examples of sensor elements 120 include photo-diodes, complimentary metal-oxide-semiconductor (CMOS) image sensors, charged coupling device (CCD) sensors, active sensors, passive sensors, and/or other devices diffused or otherwise formed in the substrate 110. In the context of the CMOS image sensors, a pixel may include a photodiode and at least one transistor. As such, the sensor elements 120 may comprise conventional and/or future-developed image sensing devices.

In the present embodiment, the semiconductor device 100 includes a plurality of sensor elements 120 disposed in an array. The plurality of sensor elements 120 may be designed to have various sensor types. For example, one group of sensor elements may be CMOS image sensors and another group of sensor elements may be passive sensors. Moreover, the sensor elements 120 may include color image sensors and/or monochromatic image sensors. The device 100 is designed to receive light 125 directed towards the backside surface of the semiconductor substrate 110 during operations, eliminating the design requirements for preventing obstruction of the optical paths by objects on the front side such as gate features and metal features, and maximizing the exposure of the light-sensing region to the illuminated light. The substrate 110 may be relatively thin so that the light directed through the back surface thereof may effectively reach the sensor elements 120.

Figure 2:
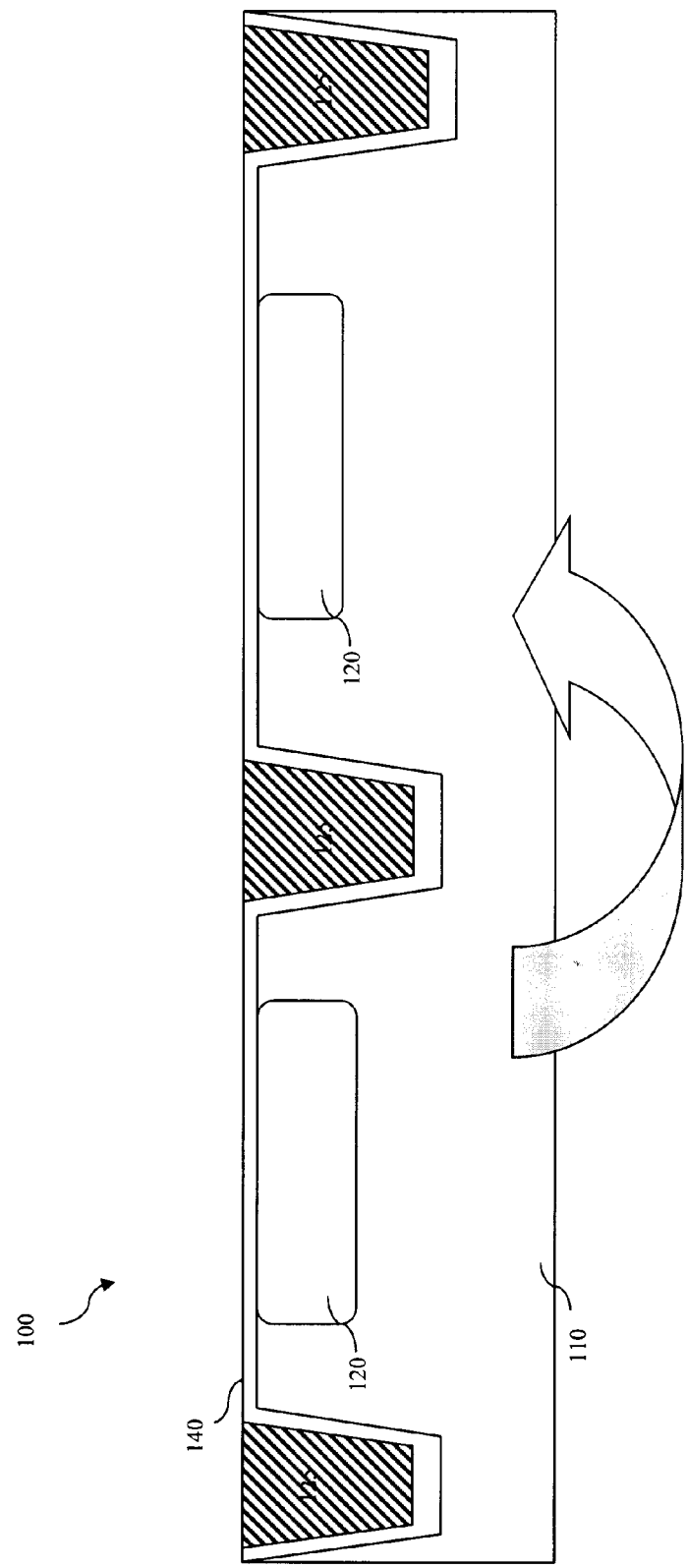
FIG. 2 is a cross section of image sensor in FIG. 1.

A cross section of image sensor in FIG. 1 is described below with reference to FIG. 2. In the present embodiment, the semiconductor substrate 110 has a first type conductivity, for example, a P-type substrate. In an alternative embodiment, the semiconductor substrate 110 may have a second type conductivity, for example, an N-type substrate. In addition, the semiconductor substrate 110 may include various doped regions each having an N-type or P-type, such as an N-well or P-well. Furthermore, in the present embodiment, the plurality of sensor elements 120 are photodiodes that are formed by implanting N-type dopant into a P-type substrate. Pinned photodiodes may be formed by forming a P-type pinned layer over the surface of the N-type photodiodes.

Isolation features 125 are positioned between the plurality of sensor elements 120. In the present embodiment, the isolation features 125 are dielectric-filled trench structures, such as shallow trench isolation (STI) structures, for device technologies that are below 35 um. Furthermore, the semiconductor device 100 may include an oxide layer 140 lining the side walls of the isolation features 125. The oxide layer 140 is interposed between the dielectric-filled isolation features 125 and the semiconductor substrate 110.

Currently, when light is projected towards the front or back side of the substrate 110 to reach the plurality of sensor elements 120, the light may spread from one sensor element to another sensor element through the semiconductor substrate 110 below the isolation features 125, which creates crosstalk. Furthermore, as the pixel pitch of the sensor elements shrinks, crosstalk between the pixels is exacerbated. In order to reduce crosstalk between the plurality of sensor elements 120, aspects of the present disclosure utilize an ion implantation technology to form a doped region below the isolation features 125. The doped region may be a first-type doped region, such as P-type doped region. The depth of the doped region is preferably greater than the depth of the sensor elements. In this way, crosstalk between the sensor elements may be effectively reduced.

Figure 3:
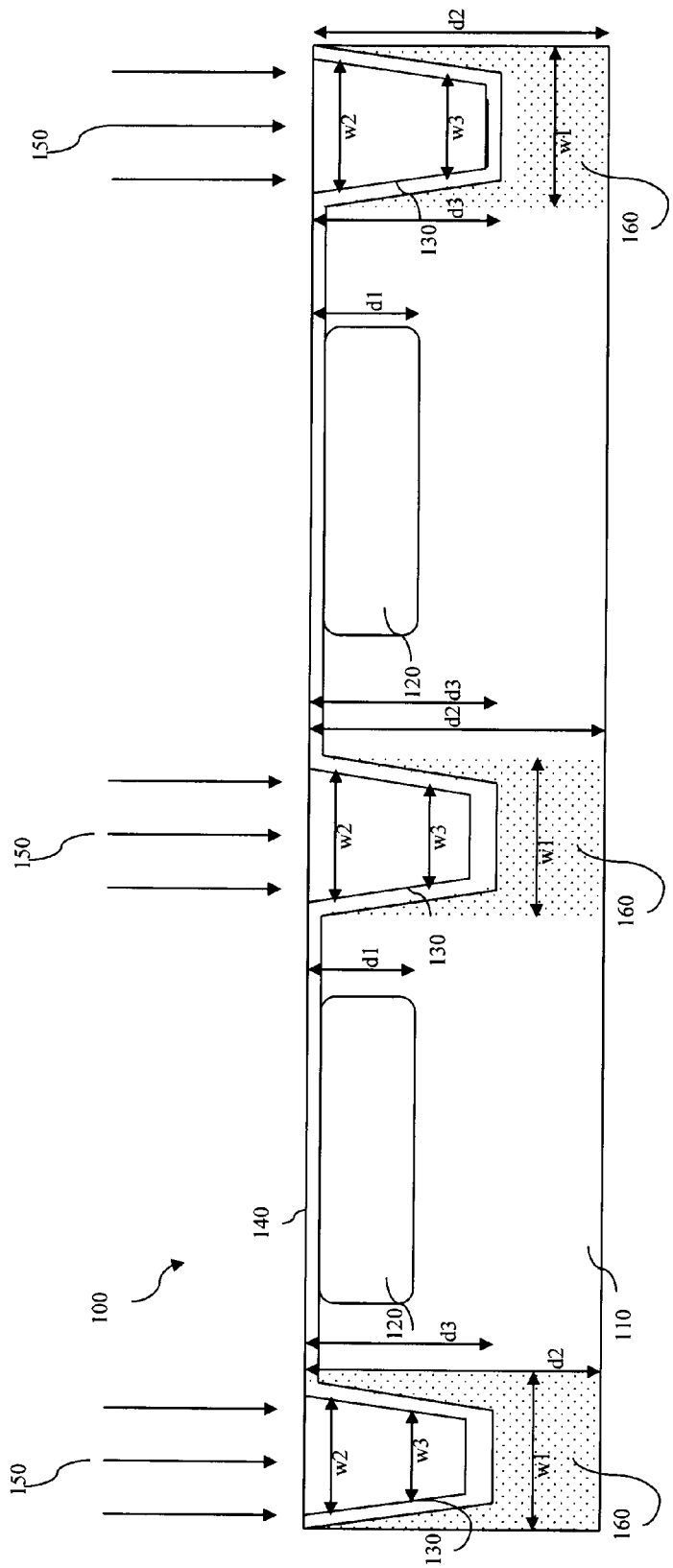
FIG. 3 is a cross section of image sensor in FIG. 2 with ion implantation.

A cross section of the image sensor in FIG. 2 with ion implantation is described below with reference to FIG. 3. In an illustrative embodiment, ion implantation is performed over the isolation trenches 130 to form the doped regions 160 below the isolation trenches 130. The ion implantation may be performed with a tilt angle from about 0 to about 90 degrees. The range of energy to apply in the ion implantation is between about 400 to 1500 KeV with a preferred range of between about 600 to 900 KeV. By implanting ions with different energy values, different depth of the doped regions 160 may be achieved. A higher energy value provides a deeper ion implantation, for example, in the center of the doped regions 160. A lower energy value provides a shallow implantation, for example, doped regions 160 around the sidewall of the isolation trenches 130.

Since the semiconductor substrate 110 in this illustrative embodiment is a P-type substrate, P-type dopant 150, such as boron, is implanted below the isolation trenches 130 to form P-type doped regions 160. The dosage of boron used in the implantation is from about $1\times10^{12}$ to about $1\times10^{14}$ atoms/$cm^2$, with a preferred dosage of between about $1\times10^{13}$ to $3\times10^{13}$ atoms/$cm^2$ After the implantation, the concentration of doped regions 160 may be from about $1\times10^{15}$ to about $1\times10^{19}$ atoms/$cm^3$. It is noted that in some embodiments, the concentration of doped regions 160 may be relatively low, since high concentrations of P-type dopant can cause out-diffusion into the N-type sensor elements 120, which may result in dark current and saturation voltage degrade. On the other hand, the concentration of doped regions 160 may be relatively high, since crosstalk may not be effectively reduced with a low concentration of dopant. Accordingly, one skilled in the art can choose a desired dopant concentration for their specific device.

Typically, the depth d1 of the sensor elements 120 is between about 0.3 um to 0.8 um. In order to effectively reduce crosstalk between the sensor elements 120, the depth d2 of the doped regions 160 is preferably greater than the depth d1 of the sensor elements, for example, for sensor elements 120 having a junction depth of about 0.5 um to about 1.0 um, the depth d2 of the doped regions 160 is at least greater than about 1.0 um or twice the depth d1 of the sensor elements 120. By having a depth d2 greater than the junction depth d1 of the sensor elements 120, the doped regions 160 may effectively reduce cross-talk between the sensor elements 120.

In this example, the depth d1 of the sensor elements 120 is measured from the upper surface of the semiconductor device 100 to the lower surface of the sensor elements 120. The depth d2 of the doped regions is measured from the upper surface of the semiconductor device 100 to the back surface of the semiconductor substrate 110.

In addition, the depth d2 of the doped regions 160 is also preferably greater than the depth d3 of the isolation trenches 130. The width w1 of the doped regions 160 is wider than the width w2 of the upper portion of the isolation trenches 130 and the width w3 of the lower portion of the isolation trenches 130.

Figure 4:
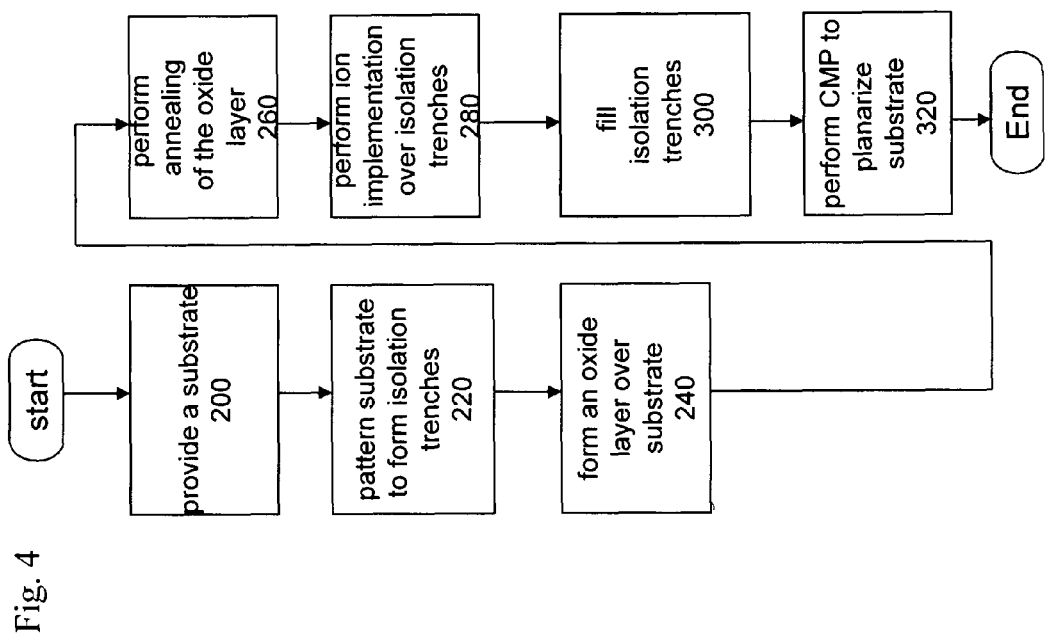
FIG. 4 is a flow diagram of a first exemplary process for reducing crosstalk in image sensors using ion implantation.

Referring to FIG. 4, a flow diagram of a first exemplary process for reducing crosstalk in image sensors using ion implantation is depicted. The process begins at step 200 by providing a substrate having a plurality of sensor elements formed therein. Next, the substrate is patterned to form isolation trenches 130 at step 220. The substrate may be patterned using processes known in the art or techniques to be developed in the future. One example is by applying a photoresist layer on the substrate and patterned using a lithography process. Then, etching is performed on the substrate to form the isolation trenches 130. In one illustrative embodiment, the isolation trenches 130 formed are shallow trench isolation (STI) features.

Once the isolation trenches 130 are formed, the process continues to step 240 where an oxide layer 140 is formed over the substrate 110 lining the side walls of the isolation trenches 130. The oxide layer 140 may be formed by a thermal process such as rapid thermal annealing (RTA).

The process then continues to step 260 to perform annealing of the semiconductor substrate 110. An ion implantation is performed at step 280 over the isolation trenches 130 to form doped regions 160 below the isolation trenches 130. The doped regions 160 may be formed by implantation methods known in the art. In an illustrative embodiment, boron 150 is used as dopants to form the doped region and is implanted with an energy ranges from about 400 to 1500 KeV and a tilt angle from about 0 to about 90 degrees. The dosage of boron used is from about $1\times10^{12}$ to $1\times10^{14}$ atoms/$cm^2$.

At step 300, isolation trenches 130 are filled with dielectric material to form shallow trench isolation (STI) features. One method of filling is by performing a high density plasma (HDP) chemical vapor deposition (CVD) to fill the isolation trenches 130. Once the isolation trenches 130 are filled, isolation features, such as isolation features 125, are formed, the process continues to step 320, where a chemical mechanical planarization (CMP) is performed to planarize the substrate 110, such that the upper surface of the isolation features 125 is substantially coplanar with the front surface of the semiconductor substrate 110.

Figure 5:
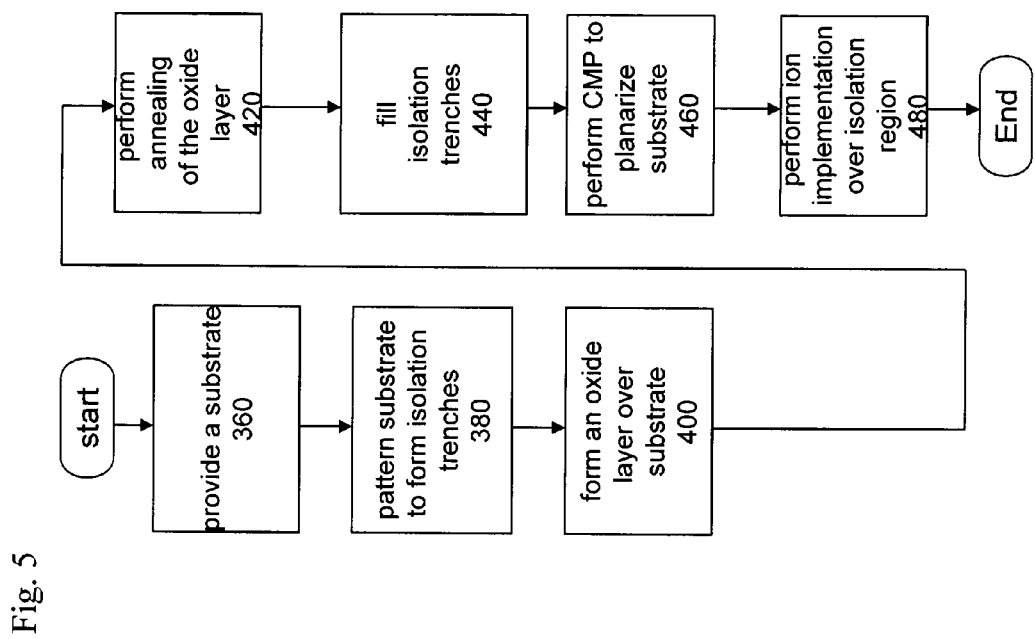
FIG. 5 is a flow diagram of a second exemplary process for reducing crosstalk in image sensors using ion implantation.

Referring to FIG. 5, a flow diagram of a second exemplary process for reducing crosstalk in image sensors using ion implantation is depicted. The process begins at step 360 where a substrate is provided having a plurality of sensor elements formed therein. Next, at step 380, the substrate is patterned to form isolation trenches 130. The substrate may be patterned using processes known in the art or techniques to be developed in the future. One example is by applying a photoresist layer on the substrate and patterned using a lithography process. Then, etching is performed on the substrate to form the isolation trenches 130.

Once the isolation trenches 130 are formed, the process continues to step 400 where an oxide layer may be formed over the substrate 110 lining the side walls of the isolation trenches 130. The oxide layer 140 may be formed by a thermal process such as rapid thermal annealing (RTA). The process then continues to step 420 to perform annealing of the oxide layer. At step 440, isolation trenches are filled with dielectric material. One method of filling is by performing a high density plasma (HDP) chemical vapor deposition (CVD) to fill the isolation trenches. Once the isolation trenches 130 are filled, isolation features are formed, the process continues to step 460, where a chemical mechanical planarization (CMP) is performed to planarize the substrate 110, such that the upper surface of the isolation features is substantially coplanar with the front surface of the semiconductor substrate 110.

An ion implantation is performed at step 480 over the isolation trenches 130 to form doped regions 160 below the isolation trenches 130. The doped regions 160 are formed by implantation methods known in the art. In an illustrative embodiment, boron is used as dopants to form the doped region and is implanted with an energy ranges from about 400 to 1500 KeV and a tilt angle from about 0 to about 90 degrees. The dosage of boron used is from about $1\times10^{12}$ to $1\times10^{14}$ atoms/cm$^2$.

Figure 6:
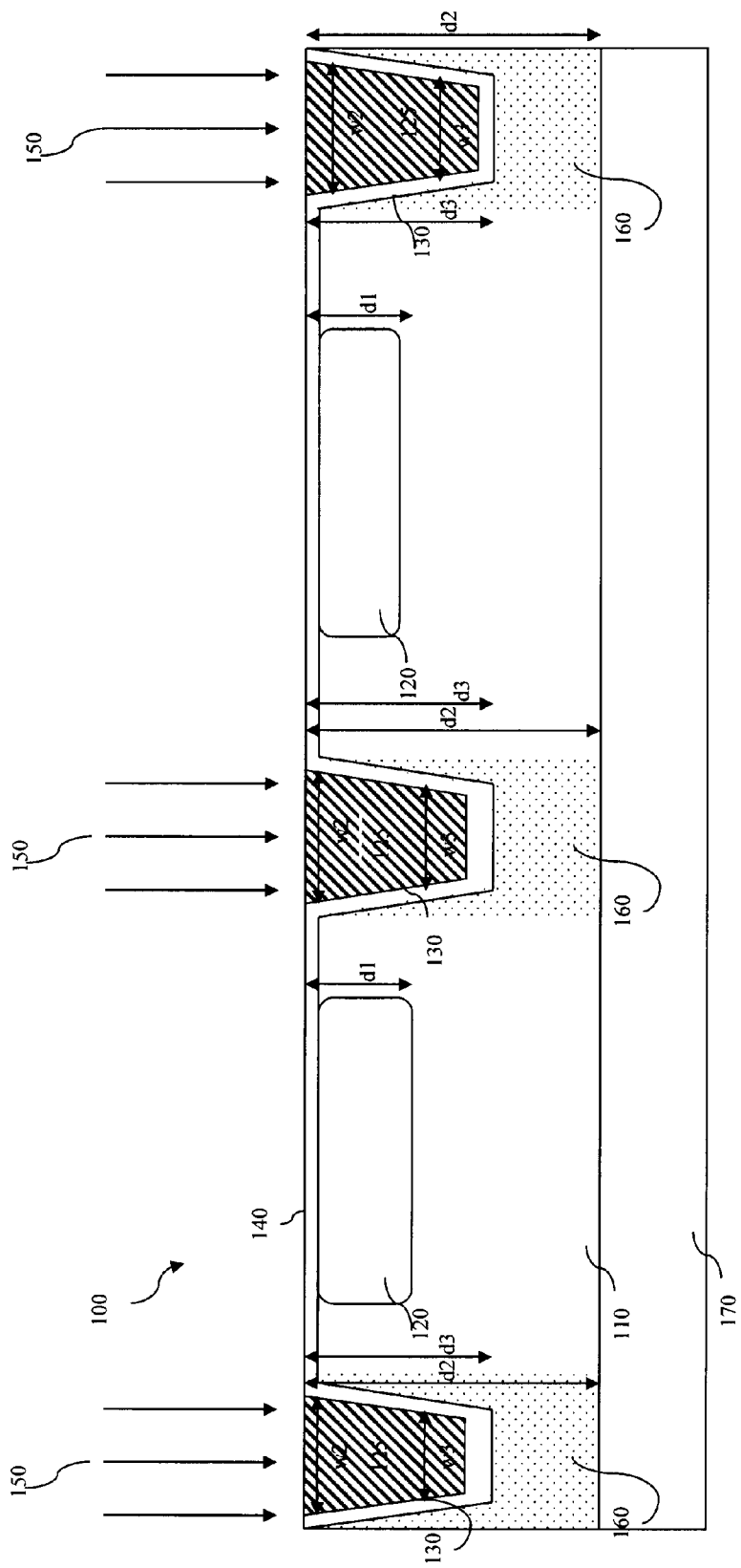
FIG. 6 is a cross section of image sensor formed using the second exemplary process.

A cross section of image sensor formed using the second exemplary process is described below with reference to FIG. 6. In this illustrative embodiment, the isolation trenches 130 of semiconductor device 100 are filled prior to the ion implantation. The isolation trenches 130 may be filled using a high density plasma (HDP) chemical vapor deposition (CVD) process commonly known in the art. The isolation trenches 130 may be filled with suitable material including dielectric, metal, an opaque material, or combination thereof. After the isolation trenches 130 are filled, isolation features, such as isolation features 125, are formed, a chemical mechanical planarization (CMP) is performed to planarize the substrate 110, such that the upper surface of the isolation features 125 is coplanar with the front surface of the semiconductor substrate 110.

The doped regions 160 may be formed by implantation methods known in the art. In this illustrative embodiment, boron 150 is used as dopants to form the doped region and is implanted with an energy range of between about 400 to 1500 KeV and a tilt angle from about 0 to about 90 degrees. The dosage of boron used is between about $1\times10^{12}$ to $1\times10^{14}$ atoms/cm$^2$. By implanting ions with different energy values, different depth of the doped regions 160 may be achieved. A higher energy value provides a deeper ion implantation, for example, in the center of the doped regions 160. A lower energy value provides a shallow implantation, for example, doped regions 160 around the sidewall of the isolation trenches 125.

In order to effectively reduce crosstalk between the sensor elements 120, the depth d2 of the doped regions 160 is preferably greater than the depth d1 of the sensor elements 120. For example, the depth d1 of the sensor elements 120 is from about 0.3 to 0.8 um. The depth d2 of the doped regions 160 is preferably greater than about 1 um or about twice the depth d1 of the sensor elements 120. By having a depth d2 greater than the junction depth d1 of the sensor elements 120, the doped regions 160 may effectively reduce cross-talk between the sensor elements 120. In this example, the depth d1 of the sensor elements 120 is measured from the upper surface of the semiconductor device 100 to the lower surface of the sensor elements 120. The depth d2 of the doped regions 160 is measured from the upper surface of the semiconductor device 100 to the back surface of the semiconductor substrate 110. The depth d2 of the doped regions 160 is also preferably greater than the depth d3 of the isolation features. In addition, the width w1 of the doped regions 160 is wider than the width w2 of the upper portion of the isolation features and the width w3 of the lower portion of the isolation features.

In addition to semiconductor substrate 110, semiconductor device 100 may comprise a second semiconductor substrate 170 under the semiconductor substrate 110. The second semiconductor substrate 170 also has a first-type conductivity, for example P-type conductivity. The concentrate of the second semiconductor substrate 170 is higher than the first semiconductor substrate 110. For example, the second semiconductor substrate 170 may be a heavy doped P-type substrate (P+) while semiconductor substrate 110 may be a lightly doped P-type substrate (P−).

Figure 7:
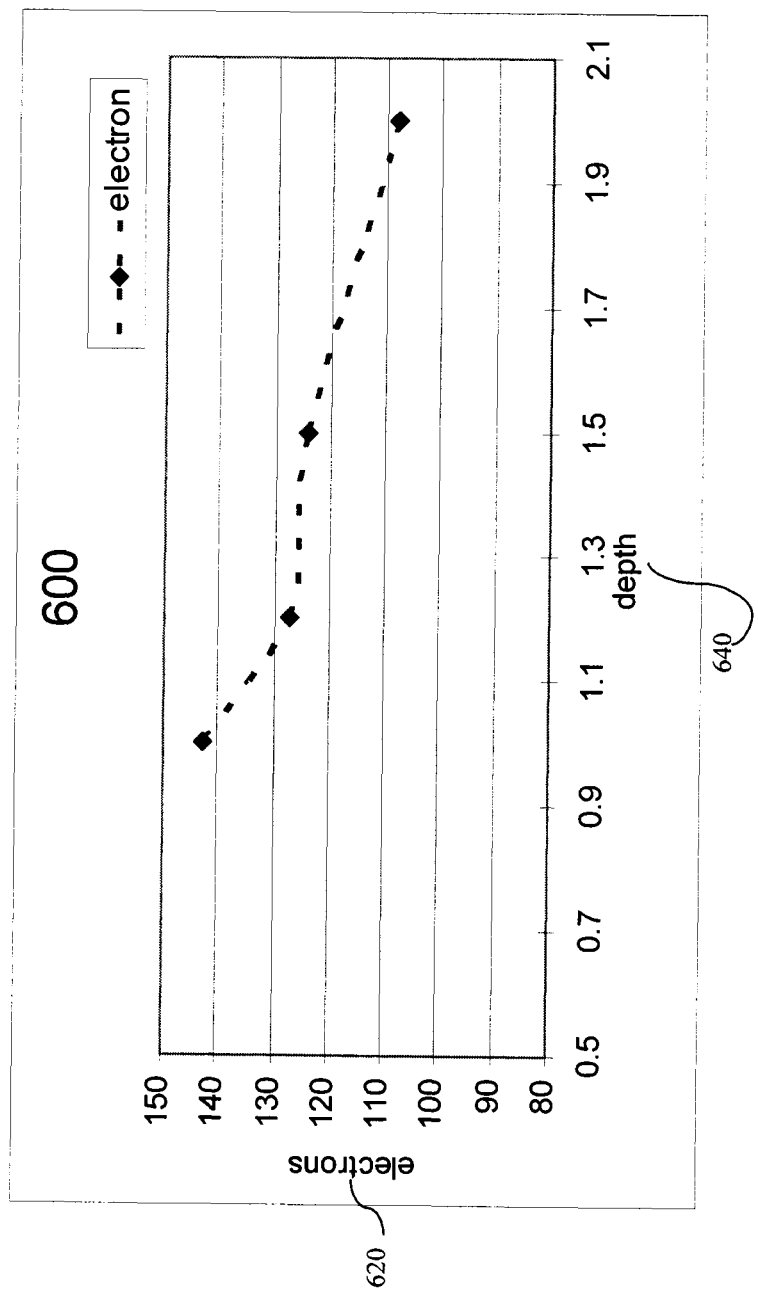
FIG. 7 is a graph illustrating relationships between crosstalk and the depth of doped regions.

Referring to FIG. 7, a graph illustrating relationships between crosstalk and the depth of doped regions is depicted. Graph 600 includes a X-axis 620 indicating the number of electrons that pass between sensor elements. Graph 600 also includes a Y-axis 640 indicating the depth of the doped region in um. As shown in graph 600, the number of electrons decreases as the depth of the doped region increases. In other words, the amount of crosstalk is reduced with a deeper doped region. In this example, the amount of crosstalk is reduced with the depth of the doped region being greater than 1 um. Therefore, by implanting ions to form doped regions 160, the amount of crosstalk between the plurality of sensor elements is reduced.

In addition to forming isolation features such as shallow trench isolation, isolation features such as local oxidation of silicon (LOCOS) may be formed. In that process, a layer of silicon nitride is deposited and patterned to serve as an oxidization barrier. The layer is etched to allow thermal oxide growth. After thermal oxidization, the nitride and the barrier oxide is removed to expose bare silicon surface regions ready for device formation. The ion implantation process to form the doped regions 160 between the sensor elements 120 may be implemented after the formation of LOCOS. Alternatively, the ion implantation may be implemented after the patterned barrier layer is formed but prior to the thermal oxide growth.

Thus, the present disclosure provides an image sensor semiconductor device. The semiconductor device includes a plurality of sensor elements formed within a semiconductor substrate; a plurality of isolation regions formed between the plurality of sensor elements; and a plurality of doped regions formed substantially underlying the plurality of isolation regions in the semiconductor substrate.

The present disclosure also provides an image sensor semiconductor device. The image sensor semiconductor device include a substrate having a front surface and a back surface; a plurality of sensor elements formed on the front surface of the substrate; a plurality of isolation regions disposed horizontally between the plurality of sensor elements; and a plurality of doped regions disposed vertically under the plurality of isolation regions in the substrate.

Each of the plurality of sensor elements may be selected from the group consisting of complementary metal-oxide-semiconductor (CMOS) image sensor, charge-coupled device sensor, active pixel sensor, passive pixel sensor, and combinations thereof. The depth of the plurality of doped regions is preferably greater than the depth of the plurality of sensor elements.

The present disclosure also provides a method to fabricate a semiconductor device. The method includes: providing a semiconductor substrate; forming a plurality of sensor elements within the semiconductor substrate; forming a plurality of isolation features between the plurality of sensor elements; and performing an ion implantation process to form a plurality of doped regions substantially underlying the plurality of isolation features.

The forming of the plurality of isolation features include etching the substrate to form a plurality of isolation features and filling the plurality of isolation features with a dielectric material. The etching may be plasma etching, wet etching, and combinations thereof. The filling of the plurality of isolation features may include performing a high density plasma chemical vapor deposition process. In addition, an oxide layer is formed over the substrate and an annealing process is performed on the oxide layer. The annealing process may be selected from the group consisting of a thermal annealing, a laser annealing, and a combination thereof.

The method of fabricating the semiconductor device further comprises planarizing the substrate before or after the filling of the plurality of isolation features. The planarizing of the substrate may include performing a chemical mechanical planarization on the substrate, such that the upper surface of the isolation features is coplanar with the front surface of the semiconductor substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device comprising:
   a semiconductor substrate having a first-type conductivity, wherein the semiconductor substrate has a front side and an opposing back side;
   a plurality of sensor elements formed in the semiconductor substrate;
   an isolation region disposed between the plurality of sensor elements; and
   a doped region having the first-type conductivity implanted substantially underlying the isolation region, wherein depth of the doped region is greater than about 1 µm, wherein the doped region having the first-type conductivity extends the entire thickness of the semiconductor substrate from the front side to the back side of the semiconductor substrate.

2. The device of claim 1, wherein the plurality of sensor elements comprises pinned photodiodes.

3. The device of claim 1, wherein the plurality of sensor elements comprises photo transistors.

4. The device of claim 1, wherein the depth of the doped region is more than twice a depth of the plurality of sensor elements.

5. The device of claim 1, wherein the depth of the doped region is greater than 2 µm.

6. The device of claim 1, wherein a width of the doped region is greater than a width of a lower portion of the isolation region.

7. The device of claim 1, wherein a width of the doped region is greater than a width of an upper portion of the isolation region.

8. The device of claim 1, wherein concentration of the doped region is from about $1\times10^{15}$ to about $1\times10^{19}$ atoms/cm3.

9. The device of claim 1, wherein the isolation region is a shallow trench isolation structure and the doped region surrounds opposing side surfaces and a bottom surface of the shallow trench isolation feature.

10. An image sensor device comprising:
    a semiconductor substrate having a first-type conductivity, wherein the semiconductor substrate has a front side and an opposing back side;
    a plurality of sensor elements formed in the semiconductor substrate;
    an isolation region disposed between the plurality of sensor elements; and
    a doped region having the first-type conductivity implanted substantially underlying the isolation region, wherein the doped region extends from the front side of the semiconductor substrate to a depth within the semiconductor substrate, wherein the depth of the doped region in the semiconductor substrate is greater than a depth of the isolation region in the semiconductor substrate.

11. The image sensor of claim 10, wherein the isolation region includes a trench that defines the depth of the isolation region in the semiconductor substrate, wherein the trench includes a liner oxide layer disposed on a surface of the trench and dielectric material disposed over the oxide layer within the trench.

12. The image sensor of claim 11, wherein the doped region having the first-type conductivity physically contacts the doped region.

13. The image sensor of claim 12, wherein the trench includes a sidewall that extends from the front side of the semiconductor substrate to the depth of the isolation region within the semiconductor substrate, and
    wherein the liner oxide layer is disposed continuously on the sidewall from the front side of the semiconductor substrate to the depth of the isolation region within the semiconductor substrate, and
    wherein the doped region continuously physically contacts the liner oxide layer on the sidewall of the trench from the front side of the semiconductor substrate to the depth of the isolation region within the semiconductor substrate.

14. The image sensor of claim 10, wherein the doped region having the first-type conductivity extends the entire thickness of the semiconductor substrate from the front side to the back side of the semiconductor substrate.

15. The image sensor of claim 10, wherein the doped region has a width that is perpendicular to the depth of the doped region, wherein the width of the doped region is substantially constant from as the doped region extends across the entire thickness of the semiconductor substrate from the front side to the back side of the semiconductor substrate.

16. An image sensor device comprising:
    a semiconductor substrate having a first-type conductivity, wherein the semiconductor substrate has a front side and an opposing back side;
    a plurality of sensor elements formed in the semiconductor substrate;
    an isolation region disposed between the plurality of sensor elements; and
    a doped region having the first-type conductivity implanted substantially underlying the isolation region, wherein a depth of the doped region is at least twice of a depth of the plurality of sensor elements, wherein the doped region physically contacts the isolation region, wherein the doped region extends to the back surface of the semiconductor substrate.

17. The image sensor of claim 16, wherein the plurality of sensor elements and the isolation region disposed between the plurality of sensor elements are proximate the front side of the semiconductor substrate.

18. The image sensor of claim 16, wherein the isolation region extends from the front side of the semiconductor substrate to the depth of the isolation region within the semiconductor substrate, and
   wherein the doped region continuously physically contacts the isolation region from the front side of the semiconductor substrate to the depth of the isolation region within the semiconductor substrate.

19. The image sensor of claim 16,
   wherein the doped region having the first-type conductivity extends the entire thickness of the semiconductor substrate from the front side to the back side of the semiconductor substrate.

20. The image sensor of claim 16, wherein the first-type conductivity is p-type.

* * * * *